(12) United States Patent
Yu

(10) Patent No.: US 7,968,446 B2
(45) Date of Patent: *Jun. 28, 2011

(54) METALLIC BUMP STRUCTURE WITHOUT UNDER BUMP METALLURGY AND MANUFACTURING METHOD THEREOF

(76) Inventor: Wan-Ling Yu, Taipei (TW)

( * ) Notice: Subject to any disclaimer, the term of this patent is extended or adjusted under 35 U.S.C. 154(b) by 230 days.

This patent is subject to a terminal disclaimer.

(21) Appl. No.: 12/246,486

(22) Filed: Oct. 6, 2008

(65) Prior Publication Data

US 2010/0084763 A1  Apr. 8, 2010

(51) Int. Cl.
*H01L 21/44* (2006.01)
(52) U.S. Cl. ............ 438/614; 438/613; 257/E21.508; 257/E23.021
(58) Field of Classification Search ............ 438/613, 438/614, 675; 257/E21.508, E23.021
See application file for complete search history.

(56) References Cited

U.S. PATENT DOCUMENTS

| 7,713,860 B2 * | 5/2010 | Yu | 438/613 |
| 7,713,861 B2 * | 5/2010 | Yu | 438/614 |
| 2002/0185721 A1 * | 12/2002 | Hwang et al. | 257/678 |
| 2003/0034173 A1 * | 2/2003 | Kaneda et al. | 174/256 |

* cited by examiner

*Primary Examiner* — Michael S Lebentritt
*Assistant Examiner* — Daniel Whalen

(57) ABSTRACT

The metallic bump is directly formed on a semiconductor wafer's I/O pad without UBM. First, a zinc layer is formed on the I/O pad or an anti-oxidation layer of the I/O pad is selectively etched off. Then, an isolative layer and a copper foil are arranged sequentially in this order above the I/O pad. The isolative layer is originally in a liquid state or in a temporarily solid state and later permanently solidified. Then, a via above the I/O pad is formed by removing part of the isolative layer and the cooper foil. Subsequently, A thin metallic layer connecting the copper foil and the I/O pad is formed in the via and a plating resist on the copper foil is formed. Then, a metallic bump is formed from the via whose height is controlled by the plating resist. Finally, the plating resist and the copper foil are removed.

28 Claims, 9 Drawing Sheets

METALLIC BUMP STRUCTURE WITHOUT UNDER BUMP METALLURGY AND MANUFACTURING METHOD THEREOF

BACKGROUND OF THE INVENTION

1. Field of the Invention

The present invention generally relates to flip-chip packaging, and more particularly to a method of forming metallic bumps on the I/O pads of a semiconductor device without under bump metallurgy and a metallic bump structure thus formed.

2. The Prior Arts

Flip-chip packaging utilizes bumps to establish electrical contact between the I/O pads of a semiconductor die (e.g., a chip) and the substrate or lead frame of the package. Conventionally, there is a so-called under bump metallurgy (UBM) located between the bump and an I/O pad of the semiconductor die.

An UBM generally contains an adhesion layer, a barrier layer and a wetting layer, arranged in this order on top of an I/O pad. The bumps themselves, based on the material used, could be classified as solder bumps, gold bumps, copper pillar bumps and bumps with mixed metals.

To form bumps on the UBMs, usually a technique such as electroplating, printing, or stud bonding is used. For electroplating, patterned plating resists are first formed on the UBMs and then metals are plated. For printing, solders are first printed on the UBMs and the solders are thermally cured into the bumps. For stud bonding, it is used for limited gold bumping only. The semiconductor die with bumps is then singulated from the semiconductor wafer, and soldered onto a substrate or lead frame.

UBM not only prevents the copper trace on the semiconductor die from dissolution into solder but also functions as a conducting plate if electroplating is the means of forming metallic bump. Besides, the wetting layer of the UBM provides reliable solderability for forming solder bump, if aluminum is used in the I/O pad.

SUMMARY OF THE INVENTION

Accordingly, a major objective of the present invention is to provide a method of forming metallic bumps directly on a semiconductor wafer's I/O pads without the expensive UBM process. The I/O pads could be made of copper or aluminum and, if the I/O pads are made of copper, could have an anti-oxidation layer made of aluminum or other anti-oxidation material.

According to an embodiment of the present invention, the method contains the following major steps. First, a zinc layer is formed on a top surface of the aluminum I/O pad or an anti-oxidation layer of the I/O pad is selectively etched off. Then, an isolative layer and a copper foil are arranged sequentially in this order above the I/O pad. The isolative layer is originally in a liquid state or in a temporarily cured state and later permanently solidified so as to reliably adhere to the semiconductor die. Then, a via above the I/O pad is formed by removing part of the isolative layer and the copper foil. Subsequently, a thin metallic layer connecting the copper foil and I/O pad is deposited in the via and a plating resist on the copper foil is laminated. Then, by using the copper foil and the thin metallic layer to conduct electrical current, a metallic bump is plated from the via, whose height is controlled by the plating resist. Finally, the plating resist and the copper foil are removed.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENT

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1A:
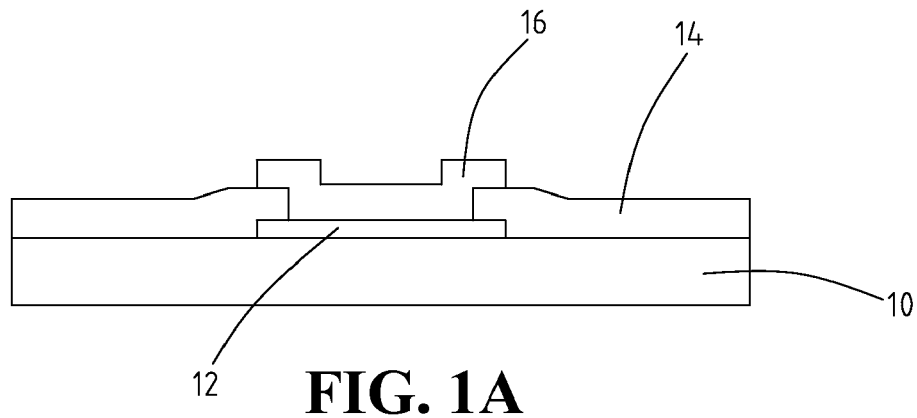
FIGS. 1A to 1H show the results of the steps of forming a metallic bump on an I/O pad according to an embodiment of the present invention.

FIGS. 1A to 1H show the results of the steps of forming a metallic bump on an I/O pad of a semiconductor wafer according to an embodiment of the present invention. As shown in FIG. 1A, the I/O pad 12 is located on a side of a semiconductor die 10 which can be an integrated circuit (IC), a transistor, a diode, or a thyristor, etc. For ease of reference, this side is referred to as the active side of the semiconductor die 10. Please note that the semiconductor die 10 is actually part of and not yet singulated from a semiconductor wafer (not shown). The semiconductor wafer could have a number of dice 10 and each semiconductor die 10 could have a number of I/O pads 12. For ease of understanding, only one semiconductor die 10 and one I/O pad 12 are shown in the accompanied drawings. Also on the active side of the semiconductor die 10, there is a passivation layer 14 which exposes part of a top surface of the I/O pad 12. Please also note that the term "semiconductor device" is used in the present specification could mean a semiconductor die as illustrated or a semiconductor wafer containing a number of these semiconductor dice.

The I/O pad 12 could be made of aluminum or copper. If the I/O pad 12 is made of copper, the I/O pad 12 usually has an anti-oxidation layer 16 made of aluminum or other anti-oxidation material to entirely cover the exposed top surface of the I/O pad 12. If the I/O pad 12 is made of aluminum, there is usually no anti-oxidation layer. If the I/O pad 12 is made of aluminum or, if the I/O pad 12 is made of copper having an aluminum anti-oxidation layer 16, a zinc layer is first coated on the aluminum surface of the I/O pad 12 by an immersion zinc process commonly known as zincation. In an alternative embodiment where the I/O pad 12 is made of copper having an anti-oxidation layer 16 made of aluminum or other anti-oxidation material, instead of coating the zinc layer, the anti-oxidation layer 16 is removed first by selective etching to expose the copper I/O pad 12 before performing the subsequent steps. The result would be similar to that of FIG. 1A without the anti-oxidation layer 16.

As a brief summary, there are three possible combinations: (1) a zinc layer coated on the aluminum I/O pad 12; (2) a zinc layer coated on the aluminum anti-oxidation layer 16 of the copper I/O pad 12; or (3) the copper I/O pad 12 is exposed by selectively etching off the anti-oxidation layer 16 made of aluminum or other anti-oxidation material. The zinc layer is usually very thin. Therefore, for simplicity, in the following the combination (2) (i.e., there is an anti-oxidation layer 16 and a zinc layer is coated on the anti-oxidation layer 16) is mainly used as example and the zinc layer is too thin to be shown. As to the combinations (1) and (3), the following description could be easily extended by imaging that the anti-oxidation layer 16 in the accompanied drawings does not exist.

Figure 1B:
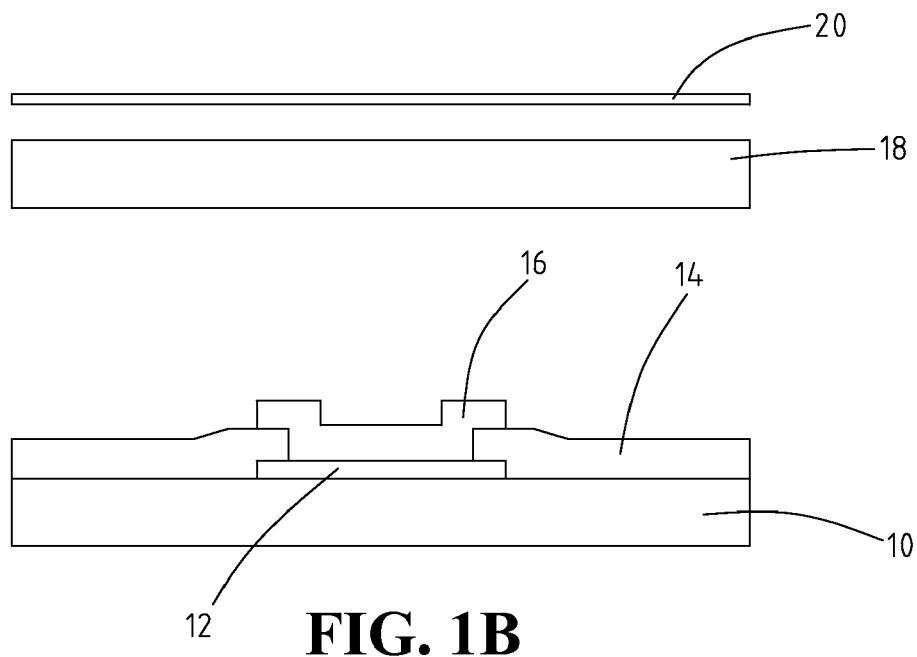
Figure 1C:
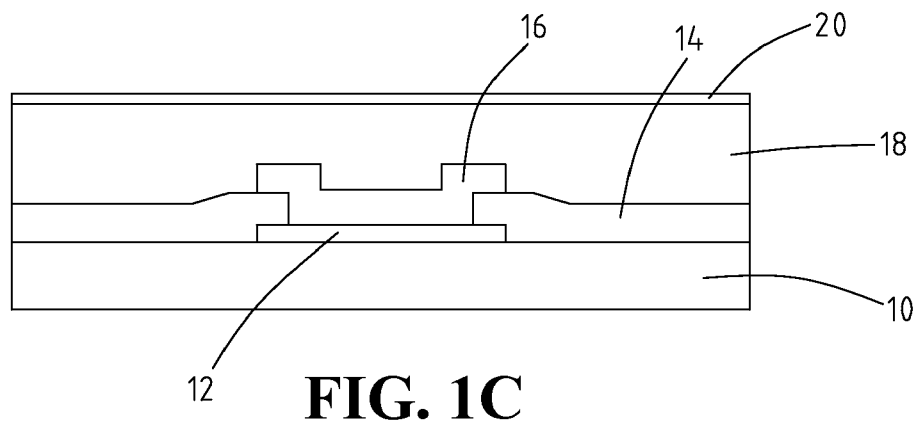

Then, an isolative layer 18 and a copper foil 20 are provided as shown in FIG. 1B. The isolative layer 18 and the copper foil 20 are arranged sequentially in this order on a top surface of the structure of FIG. 1A and the result is shown in FIG. 1C. The material for the isolative layer 18 is one such that the isolative layer 18 is in a liquid state (A Stage) or in a temporarily cured state (B Stage), so that the isolative layer 18 can reliably adhere to the structure of FIG. 1A. Various types of polymers such as epoxy resin are ideal materials for the isolative layer 18. Then, by applying appropriate heat and pressure to the isolative layer 18 in the liquid state or in the temporarily cured state, the isolative layer 18 is permanently solidified (C Stage) and thereby tightly adheres to the structure of FIG. 1A. If an isolative material in temporarily cured state is chosen, the isolative material should be able to turn into liquid state again within a specific temperature range during curing. In one embodiment, the copper foil 20 is coated with the isolative layer 18 first, and the combination is then stacked to the top surface of the structure of FIG. 1A. Subsequently, by applying appropriate heat and pressure to the isolative layer 18, it is permanently solidified, thereby tightly adheres to the structure of FIG. 1A. In an alternative embodiment, the isolative layer 18 is in a temporarily cured state or a liquid state and is stacked on the top surface of the structure of FIG. 1A first. Subsequently, the copper foil 20 is stacked on the top surface of the isolative layer 18. Then, by applying appropriate heat and pressure, the isolative layer 18 is permanently solidified, thereby tightly adheres to the structure of FIG. 1A. Optionally, the isolative layer 18 can be reinforced with glass fiber. In addition, the copper foil 20 could be optionally thinned down if a fine pitch bump or tiny bump is to be formed.

Figure 1D:
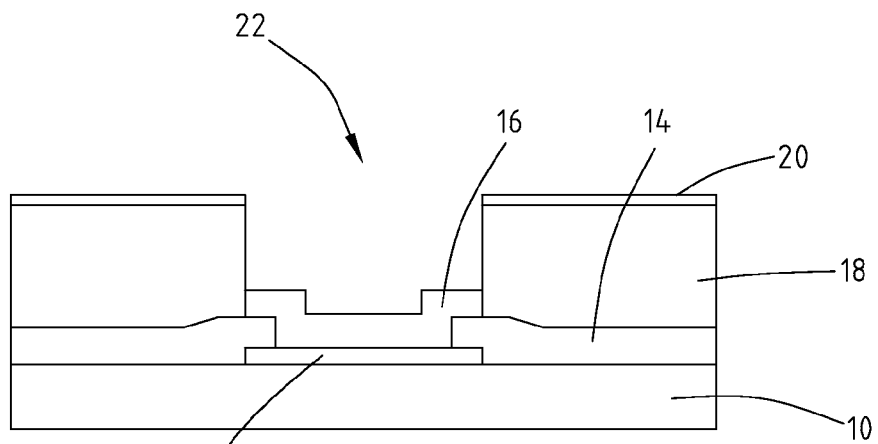

Then, a part of the copper foil 20 above the I/O pad 12 is removed by laser ablation or chemical etching first and then a part of the isolative layer 18 above the I/O pad 12 is removed by laser ablation or lithographic means. A via 22 exposing a top surface of the zinc layer of the I/O pad 12 (or, the copper I/O pad 12 if anti-oxidation layer 16 is etched off earlier by selective etching) is thereby formed as shown in FIG. 1D. During the lamination of the copper foil 20 and the isolative layer 18 on the semiconductor device, the semiconductor device can be a whole semiconductor wafer without separation or part of a semiconductor wafer after cutting and separation.

As mentioned earlier, if the I/O pad 12 is made of aluminum or the I/O pad 12 has anti-oxidation layer 16 made of aluminum, the zinc layer is coated on the I/O pad 12 or the aluminum anti-oxidation layer 16 of the I/O pad 12 by an immersion zinc process before the stacking of the isolative layer 18 and the copper foil 20. In an alternative embodiment, the zinc layer could be coated on the I/O pad 12 or the aluminum anti-oxidation layer 16 of the I/O pad 12 by an immersion zinc process after the via 22 of FIG. 1D is formed with the same method mentioned above. If the I/O pad 12 is made of copper having an anti-oxidation layer made of aluminum or other anti-oxidation material, selectively etching the anti-oxidation layer off to expose the copper I/O pad 12 can also be carried out after the via 22 of FIG. 1D is formed.

Figure 1E:
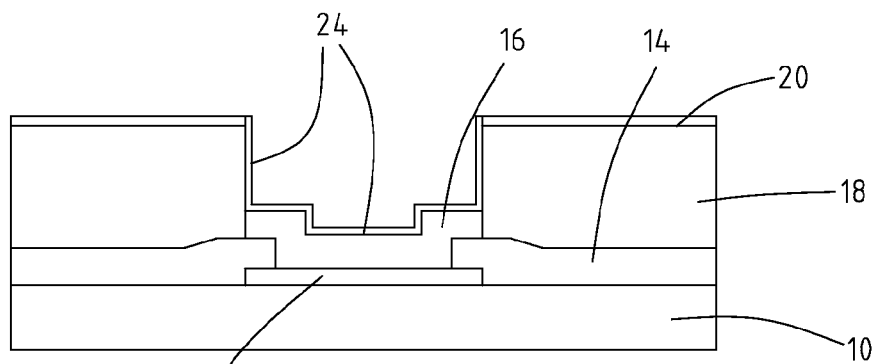
Figure 1F:
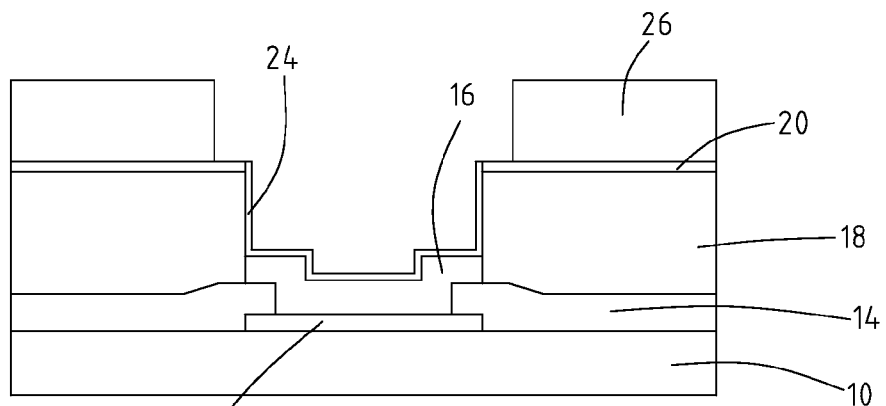
Figure 1G:
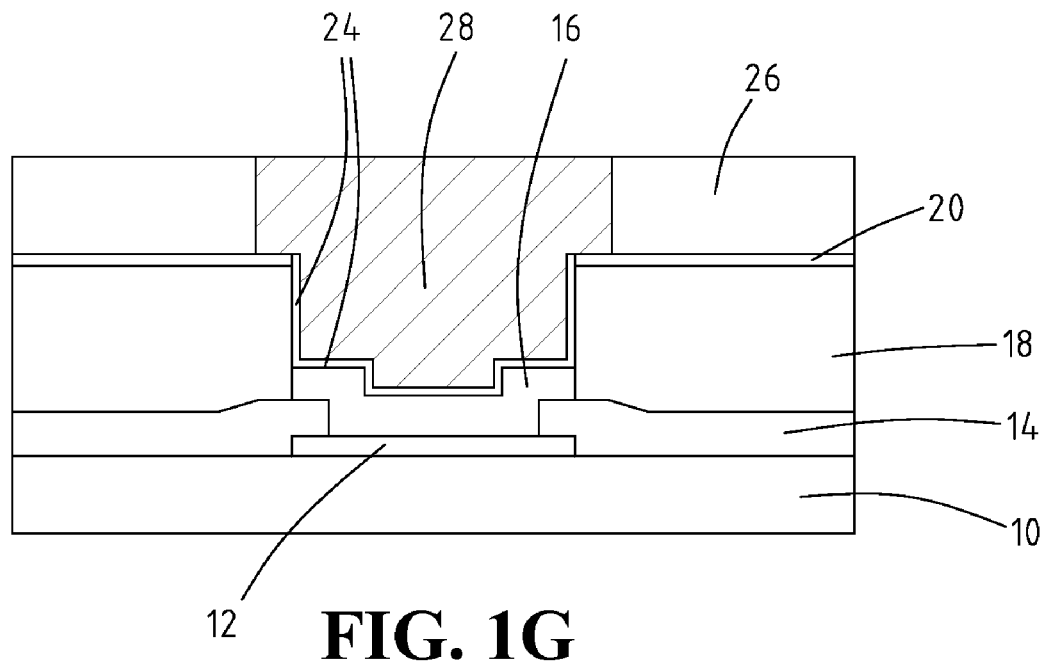

Subsequently, a thin metallic layer 24 is formed at least in the via 22 by using electroless deposition of copper or nickel so that the thin metallic layer 24 connects the copper foil 20 to the top surface of the zinc layer (or the copper I/O pad 12 if the anti-oxidation layer 16 is etched off selectively), as shown in FIG. 1E. For enhanced reliability, optionally, an additional metal layer could be further formed by electroplating (or electroless deposition) on an external surface of the thin metallic layer 24. For simplicity, the plated metal layer is not shown. Then, a plating resist 26 is coated by using a photo imageable film lamination and patterned by applying light exposure selectively on a top surface of the copper foil 20 with a plating opening (not numbered) to expose the via 22 coated with the thin metallic layer 24 as shown in FIG. 1F. As such, the copper foil 20 and the thin metallic layer 24 together can jointly conduct electrical current to plate a metallic bump 28 in the via 22 above the I/O pad 12, as shown in FIG. 1G. The material of the metallic bump 28 could be chosen from a group of gold, copper, tin, nickel, solder, and a combination thereof, which has good adhesion capability to the thin metallic layer 24 and good solderability in assembly.

Figure 1H:
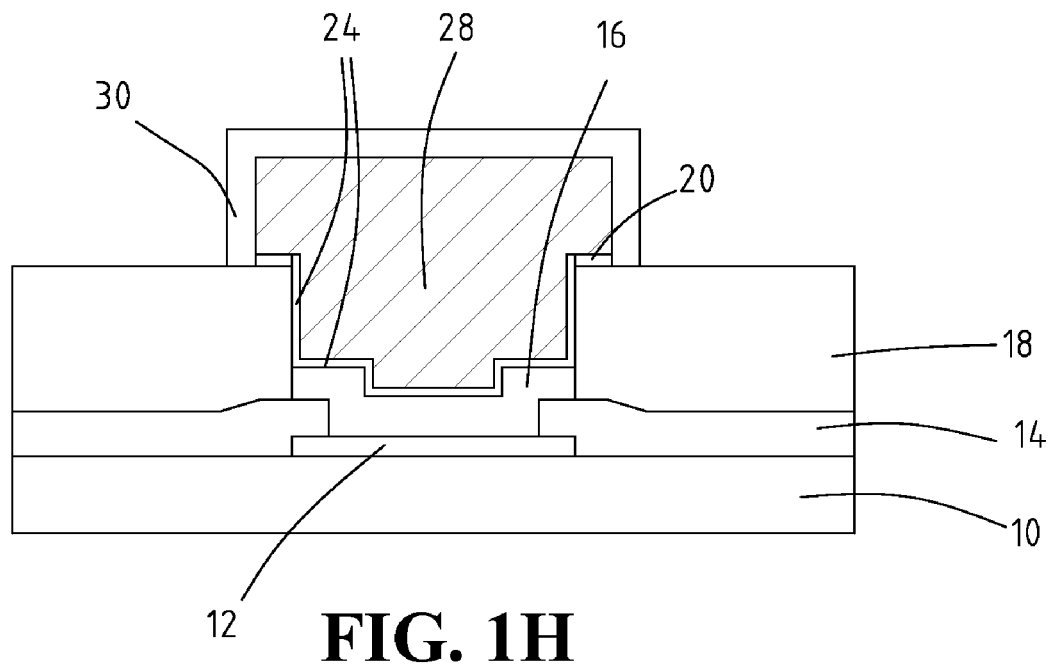

Finally, as shown in FIG. 1H, the plating resist 26 is stripped off and, by using laser or chemical etching, part of the copper foil 20 under the plating resist 26 is also removed. Then, the metallic bump 28 can be further and optionally covered with a coating layer 30 at least on a top surface of the metallic bump 28 (in the drawing, the metallic bump 28 is entirely covered) so as to prevent the metallic bump 28 from oxidation before assembly. Depending on the material of the metallic bump 28, various materials could be used as the coating layer 30. For example, for nickel bump 28, a coating layer 30 made of gold could be used and, for copper bump 28, the coating layer 30 could be made of OSP (Organic Solderability Preservative), electroless nickel immersion gold, immersion silver or immersion tin, just to name a few. In an alternative embodiment, the coating layer 30 is formed on a top surface of the structure of FIG. 1G by electroplating before the plating resist 26 is stripped off. Then, the plating resist 26 and part of copper foil 20 under the plating resist 26 are removed. The produced result would be similar to that of FIG. 1H except that there is no coating layer 30 at the lateral sides of the metallic bump 28. The formation of the metallic bump 28 is therefore completed. The height of the metallic bump 28 can be controlled by having the plating resist 26 to be of an appropriate height and the width of the metallic bump 28 is determined by adjusting the aperture of the plating opening on the plating resist 26.

In an alternative embodiment, the isolative layer 18 in a liquid state is applied to the structure of FIG. 1A alone without the copper foil 20. The isolative layer 18 is then solidified into the temporarily cured state first and the via 22 exposing the zinc layer of the I/O pad 12 (or the copper I/O pad 12 if the anti-oxidation layer 16 is etched off selectively) is formed. Then, the copper foil 20 is stacked on the temporarily cured isolative layer 18. Afterwards, the isolative layer 18 is solidified permanently together with the copper foil 20. Then, after part of the copper foil 20 above the via 22 is removed by chemical etching or laser ablation, the result is the same as what is shown in FIG. 1D. The same subsequent steps as described above can be conducted to form the metallic bump

28. During the coating of the isolative layer 18 on the semiconductor device, the semiconductor device can be a whole semiconductor wafer without separation or part of a semiconductor wafer after cutting and separation.

In yet another alternative embodiment where the copper foil 20 is not used at all, the isolative layer 18, in a liquid state or a temporarily cured state, is stacked on the structure of FIG. 1A and solidified permanently alone. Then, the via 22 exposing the zinc layer of the I/O pad 12 (or the copper I/O pad 12 if the anti-oxidation layer 16 is etched off selectively) is formed. The thin metallic layer 24 is subsequently formed on the top surface of the isolative layer 18 and in the via 22 by sputtering or electroless deposition. The thin metallic layer 24 is then optionally thickened to achieve better conductivity by electroplating (or electroless deposition) and the result would be similar to what is shown in FIG. 1E. The thickened metallic layer 24 on top of the isolative layer 18 will perform the function of the copper foil 20 in previous embodiments. The same subsequent steps as described above can be conducted to form the metallic bump 28. In this embodiment, an isolative layer such as ABF (Ajinomoto Build-up Film) with good adhesion to electroless metallic deposition is preferable for better reliability, particularly while rerouting is required in the bumping process. During the coating of the isolative layer 18 on the semiconductor device, the semiconductor device can be a whole semiconductor wafer without separation or part of a semiconductor wafer after cutting and separation.

In still another alternative embodiment where the isolative layer 18 is also stacked on the structure of FIG. 1A without the copper foil 20 and solidified permanently alone, the thin metallic layer 24 is formed on the top surface of the isolative layer 18 by sputtering or electroless deposition. The via 22 exposing the zinc layer of the I/O pad 12 (or the copper I/O pad 12, if the anti-oxidation layer 16 is etched off selectively) is then formed. Subsequently, the thin metallic layer 24 is formed again to cover at least the via 22 by electroless deposition or sputtering. The thin metallic layer 24 is optionally thickened to achieve better conductivity by electroplating (or electroless deposition) and the result would be similar to what is shown in FIG. 1E. The thickened metallic layer 24 on top of the isolative layer 18 will perform the function of the copper foil 20 in previous embodiments. The same subsequent steps as described above can be conducted to form the metallic bump 28. During the coating of the isolative layer 18 on the semiconductor device, the semiconductor device can be a whole semiconductor wafer without separation or part of a semiconductor wafer after cutting and separation.

To form the via 22 so that it exposes the zinc layer of the I/O pad 12 (or the copper I/O pad 12, if the anti-oxidation layer 16 is etched off selectively) precisely, the location coordinates of the I/O pad 12 has to be determined first. To achieve that, fiducial marks can be prepared in advance on a bottom side of the semiconductor device. Then, by inspecting the coordinates of the fiducial marks and their positional relationship to the I/O pad 12, the exact location coordinates of the I/O pad 12 can be determined. An alternative approach is to utilize an X-ray apparatus that penetrates through the copper foil 20 of FIG. 1C to directly determine the exact location coordinates of the I/O pad 12. Another alternative approach is, after removing part of the copper foil 20, to use a camera to detect the fiducial marks on the semiconductor device and then calculate the location coordinates of the I/O pad 12.

Figure 2:
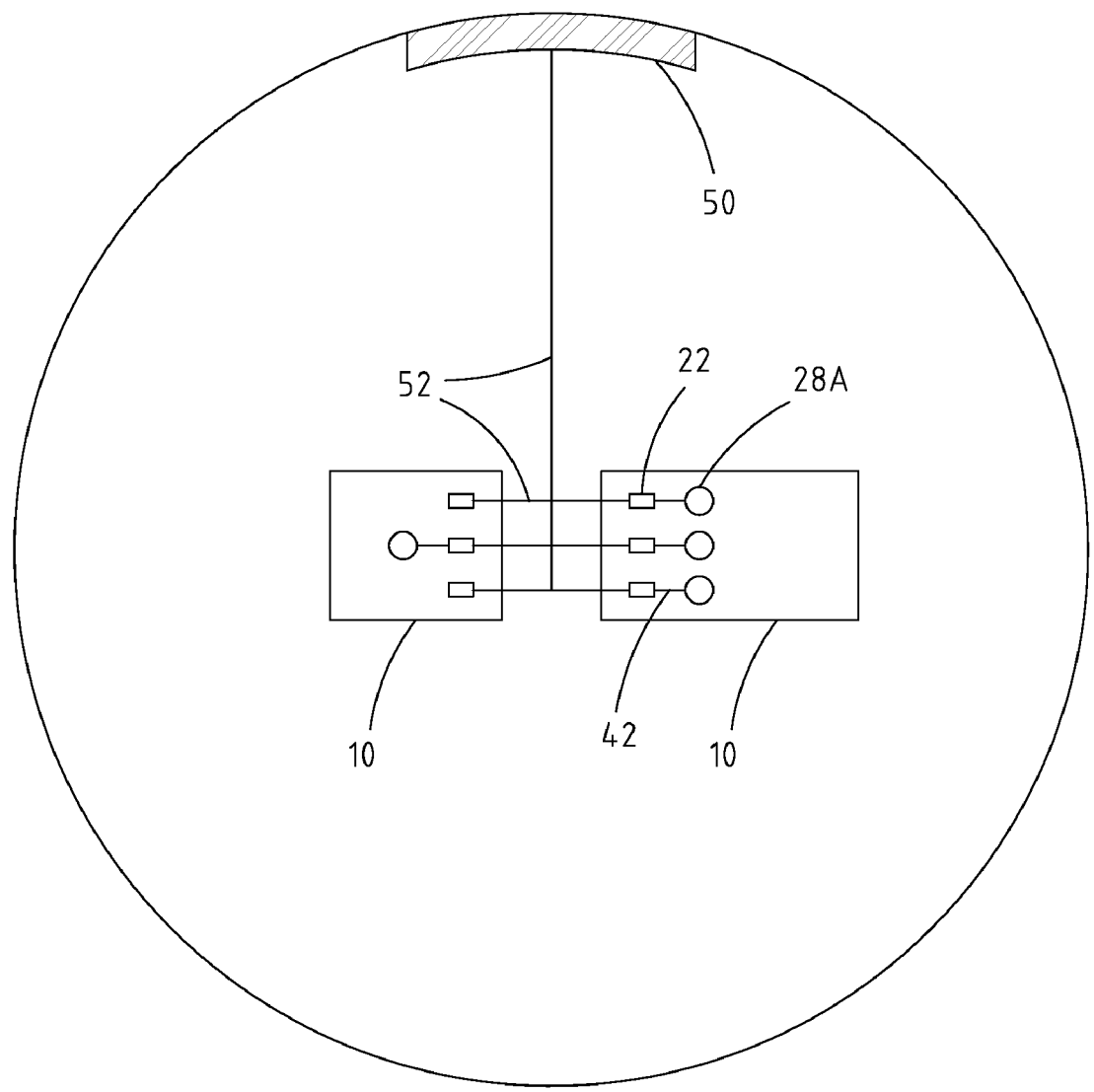
FIG. 2 is a schematic top view showing a semiconductor die of a semiconductor wafer having rerouted metallic bumps and plating net.

Bump rerouting is sometimes required because metallic bumps on original locations of the I/O pads are not suitable for soldering in the following assembly process and the conventional UBM process could rearrange the bumps to appropriate locations for subsequent soldering. Since the present invention omits the expensive UBM process, to achieve bump rerouting as shown in FIG. 2, the rerouted bumps 28A and the routing traces 42 laterally to the vias 22 have to be formed at appropriate locations. FIGS. 3A through 3D show the additional steps of extending the method of the present invention to achieve bump rerouting.

Figure 3A:
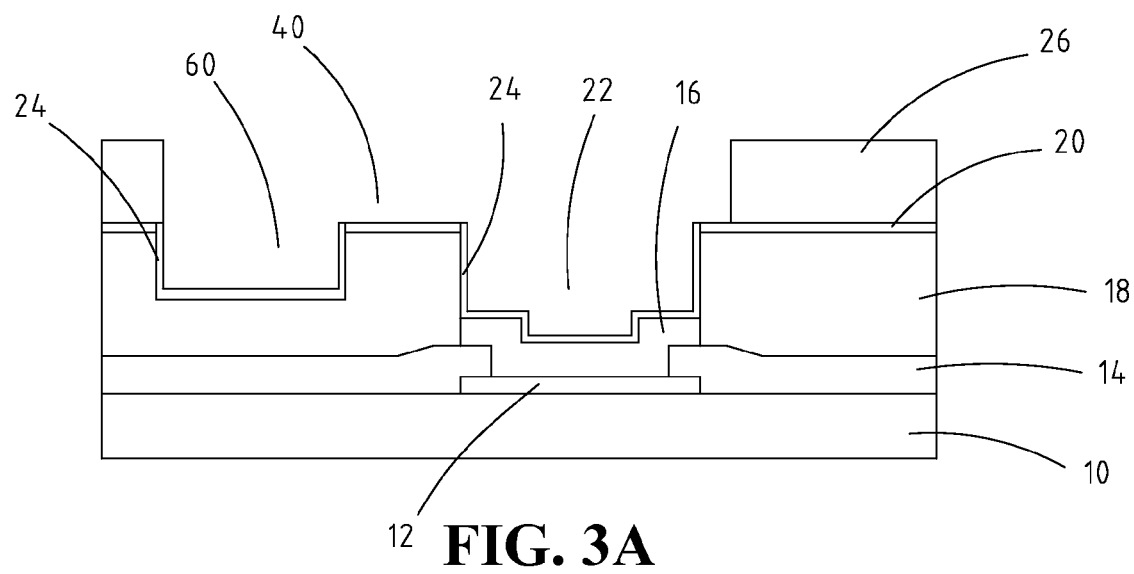
FIGS. 3A to 3D show the additional steps of extending the method of FIGS. 1A to 1H to achieve bump rerouting.

FIG. 3A shows a structure which is formed according to the steps illustrated by FIGS. 1A to 1F. The structure of FIG. 3A, however, is different from that of FIG. 1F in that the plating resist 26 has a plating opening 40 to expose not only the via 22, but also a designated location of the rerouted metallic bump 28A and a laterally routing trace 42 connecting the designated location of the metallic bump 28A and the via 22. To improve mechanic strength of the rerouted metallic bump 28A, ablating a blind hole 60 concurrently with the via 22 under the designated location of the rerouted metallic bump 28A is recommended. The thin metallic layer 24 is also deposited into the blind hole 60 under the rerouted metallic bump 28A as well before the plating resist 26 is laminated. Alternatively, a conductive paste can be filled into the blind hole 60 and solidified to replace the deposition of thin metallic layer 24.

Figure 3B:
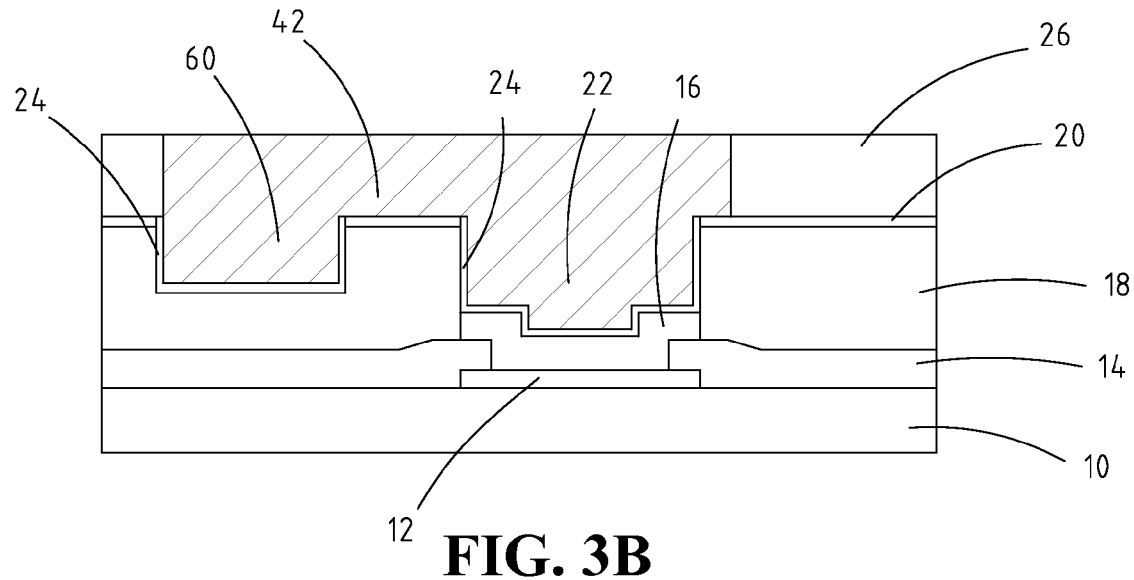
Figure 3C:
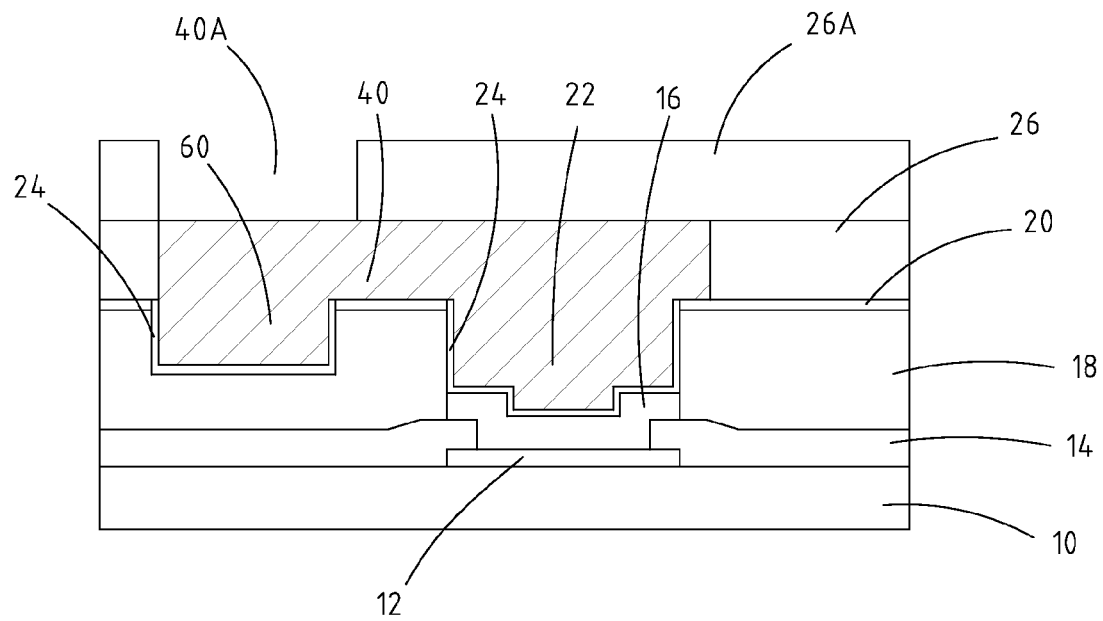
Figure 3D:
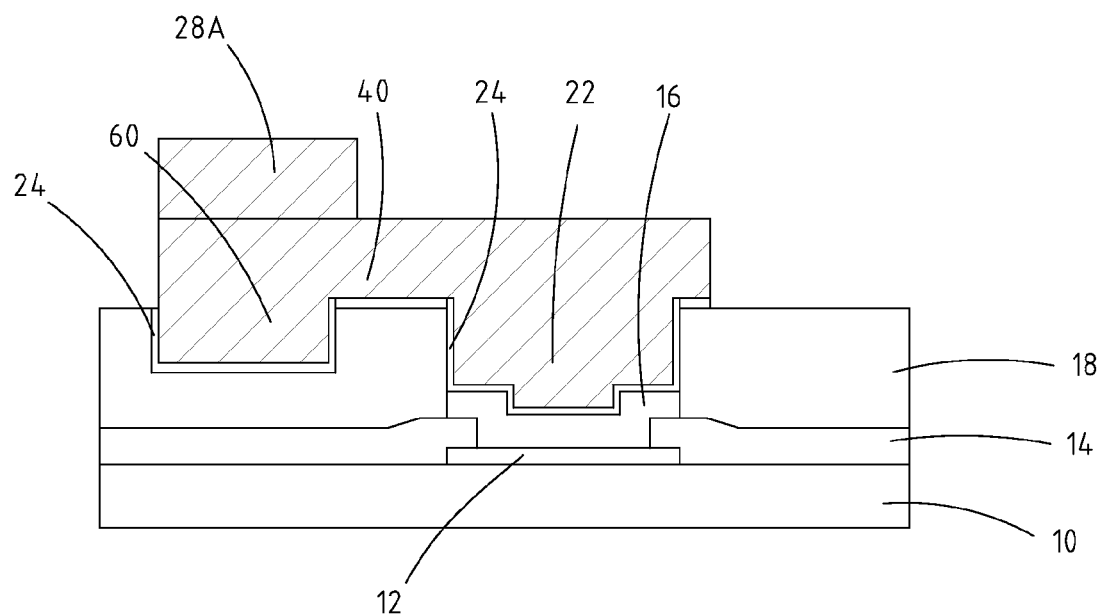

Then, as shown in FIG. 3B, copper or other suitable metal is plated until a designed thickness is reached so as to form the routing trace 42. Subsequently, as shown in FIG. 3C, a second plating resist 26A is formed on a top surface of the plating resist 26 and the routing trace 42 with opening 40A only at the designed location of the rerouted metallic bump 28A (i.e., above the blind hole 60), and an appropriate metal such as copper, nickel, solder, tin, gold, or a combination thereof is plated until the rerouted metallic bump 28A is formed at the designed location with a designed thickness. Finally, as shown in FIG. 3D, the plating resists 26 and 26A are removed, and part of the copper foil 20 under the plating resist 26 is etched off by chemical etching or laser ablation so that the rerouted metallic bump 28A and the connecting trace 42 are completed. Optionally, a solder mask will be subsequently applied to cover the via 22 and routing trace 42 for protection.

In an alternative embodiment, the plating resist 26 has plating opening to expose the via 22, the designed location of rerouted metallic bump 28A, the laterally routing trace 42 connecting via 22 and the designated location, and one or more plating bars 52 connecting a plating net (i.e., a net containing the rerouted metallic bump 28A, the via 22, and the routing trace 42) to an plating electrode 50 of the semiconductor wafer as shown in FIG. 2. Then, copper or other suitable metal is plated to a designed thickness to form the routing trace 42 and the plating bar 52. The plating resist 26 is first stripped off and part of the copper foil 20 under the plating resist 26 is etched off by laser ablation or chemical etching. Then, an optional solder mask is applied on the semiconductor die 10 with opening on the designed location of rerouted metallic bump 28A. Subsequently, a second plating resist 26A is laminated on the solder mask with opening on the designed location of rerouted metallic bump 28A. An appropriate metal such as copper, nickel, solder, tin, gold, or a combination thereof is plated using the plating bar 52 to conduct electrical current until the rerouted metallic bump 28A is formed at the designed location with a designed thickness. Finally, the second plating resist 26A is stripped off and the plating bar 52 is etched off. The rerouted metallic bump 28A is then completed. Please note that these steps are quite similar to the previous embodiments and therefore no additional drawing is provided.

Figure 4A:
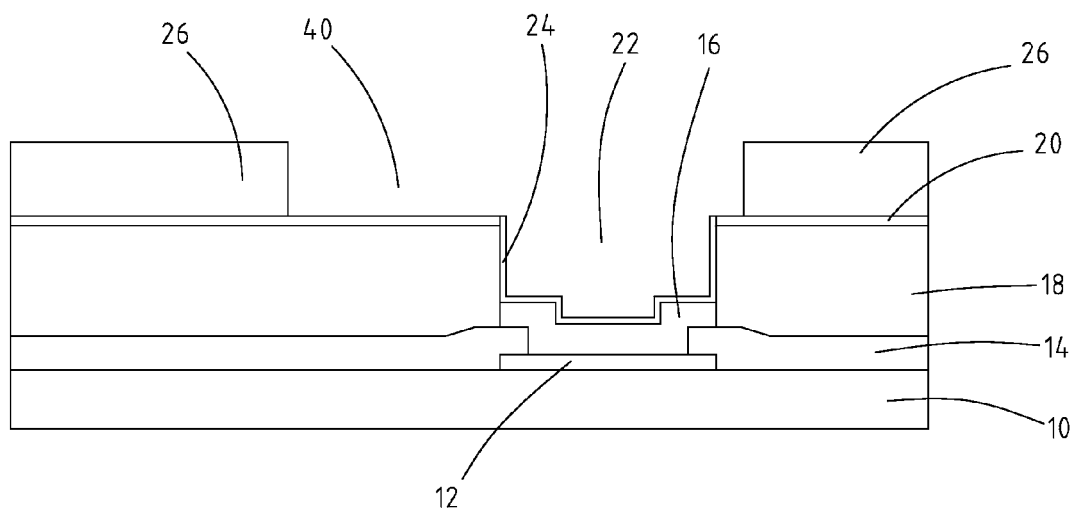
FIGS. 4A to 4E show the steps to achieve bump rerouting through two layers of traces.
Figure 4B:
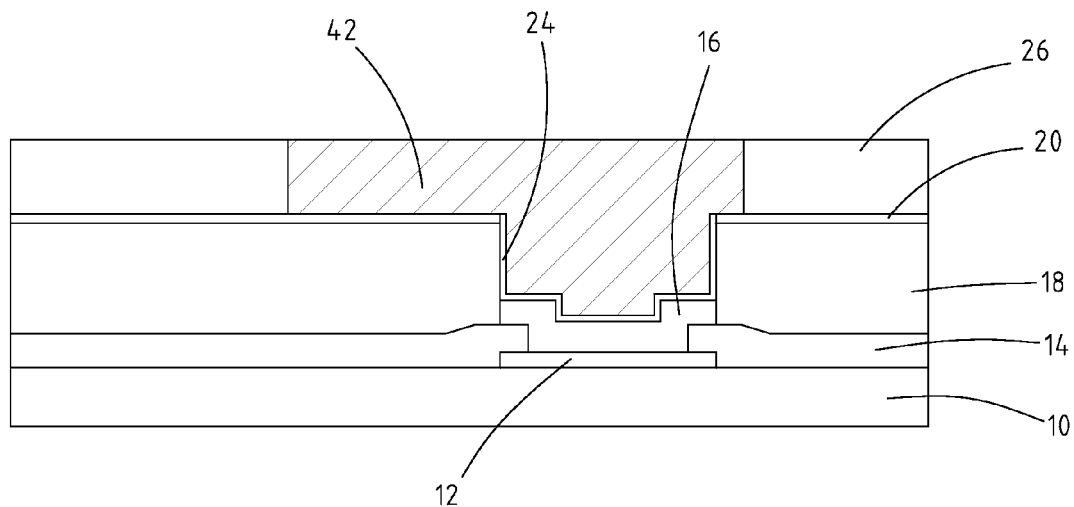
Figure 4C:
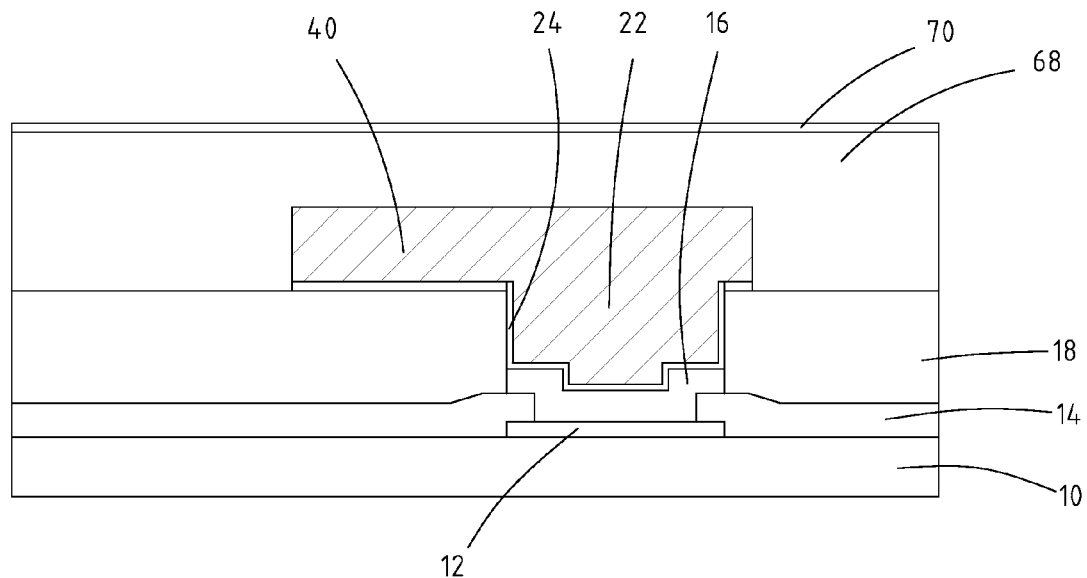
Figure 4D:
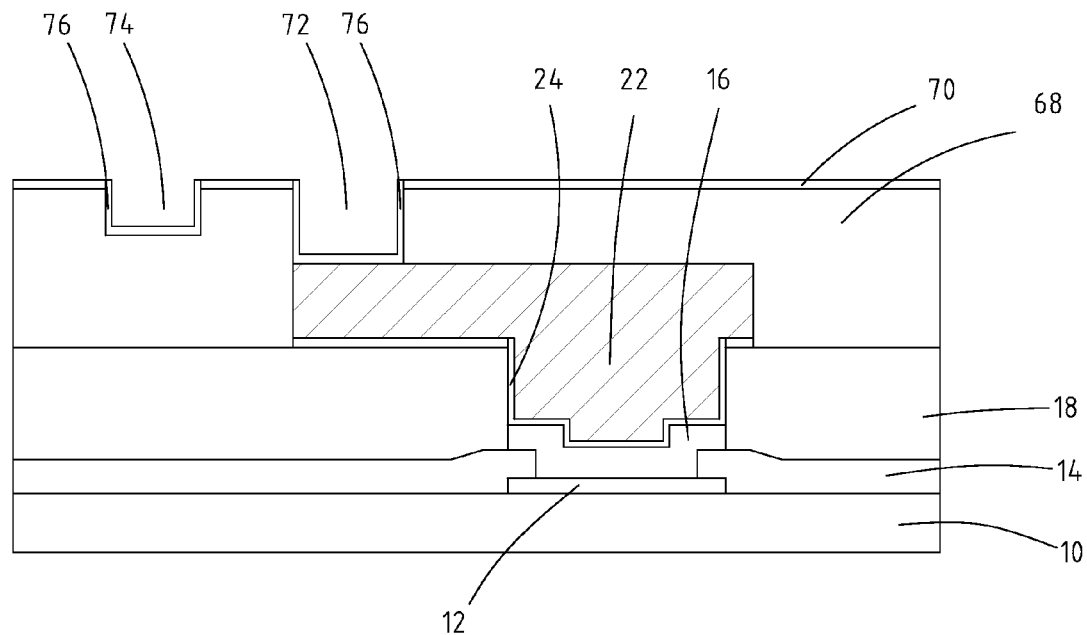

Sometimes, if rerouting is difficult to achieve with a single layer of trace as described above, multiple layers of traces could be used with the routing trace(s) on the lower layer(s)

ended at some intermediate point(s). One embodiment is described as follows and shown in FIGS. 4A to 4D. According to the steps 1A to 1F and after the thin metallic layer 24 is coated in the via 22, the plating resist 26 is laminated on the copper foil 20 with opening to expose the via 22, an intermediate location, and the laterally routing trace 42 connecting the via 22 and the intermediate location, as shown in FIG. 4A. Copper or other suitable metal is plated until a designed thickness is achieved to form the routing trace 42, as shown in FIG. 4B. Then the plating resist 26 is stripped off and part of copper foil 20 under the plating resist 26 is etched off by laser ablation or chemical etching. Then, a second isolative layer 68 and a second copper foil 70 are laminated on the semiconductor die 10 and permanently solidified, as shown in FIG. 4C. Please note that the various approaches in laminating the second isolative layer 68 and the second copper foil 70 described above could be applied here as well and their details are omitted here for simplicity. A part of the second copper foil 70 and the second isolative layer 68 on top of the intermediate location is removed by similar methods mentioned above for form a second via 72 exposing the intermediate location, as shown in FIG. 4D. Again, to improve mechanic strength of the rerouted metallic bump 28A, ablating a blind hole 74 concurrently with the second via 72 under the designated location of the rerouted metallic bump 28A is recommended. Then, a thin metallic layer 76 is deposited into the blind hole 74 under the rerouted metallic bump 28A and the second via 72. Alternatively, a conductive paste can be plugged into the blind hole 74 and solidified to replace the deposition of thin metallic layer 74.

Figure 4E:
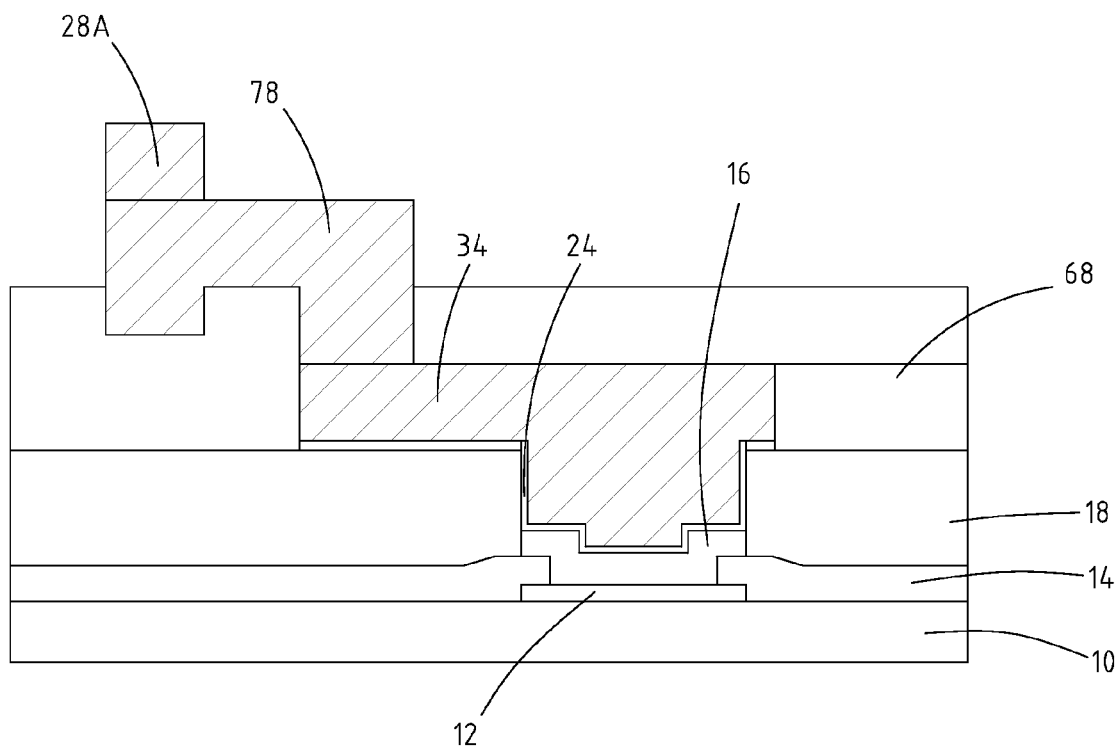

The similarity between the structure shown in FIG. 4D and the structure shown in FIG. 3A should be quite straight forward. Therefore, the same steps described in FIG. 3A to FIG. 3D are conducted to form a second layer of trace 78 and the rerouted metallic bump 28A connected to the second via 72 at the intermediate location by the second layer of trace 78. The result is illustrated in FIG. 4E. The foregoing processes could actually be repeated to reroute the metallic bump through more intermediate locations and more layers of routing traces.

The most significant benefits of the present invention are as follows. First an element selected from a large collection of highly conductive metallic materials such as gold, silver, palladium, copper, tin, solder, nickel, etc., or any combination of these highly conductive metallic materials can be used to form the metallic bump 28 through electroless deposition and electroplating. Secondly, the metallic bump 28's bonding to the semiconductor die 10 is enhanced by the additional adhesion provided by the isolative layer 18, thereby achieving a superior bonding between the metallic bump 28 and the semiconductor die 10. Thirdly, the expensive UBM process could be omitted entirely because, instead of UBM, the copper foil 20 functions as an electroplating connection during the formation of the metallic bumps and a chosen barrier layer coated on metallic bump 28 can protect the copper trace from dissolving if copper is used in I/O pad, thereby lower down the production cost significantly.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method of forming a metallic bump on an I/O pad on an active side of a semiconductor device, comprising the steps of:
   arranging an isolative layer and a copper foil in this order on said active side of said semiconductor device;
   forming a via in said isolative layer and said copper foil above said I/O pad;
   forming a thin metallic layer at least in said via, said thin metallic layer connected to said copper foil and said I/O pad;
   forming a first plating resist on a top surface of said copper foil, said first plating resist having a first opening at least exposing said via coated with said thin metallic layer; and
   plating a metallic material in said first opening until an appropriate thickness is achieved.

2. The method according to claim 1, further comprising the step of:
   if said I/O pad is made of aluminum or said I/O pad has an anti-oxidation layer made of aluminum, forming a zinc layer on a top surface of said aluminum I/O pad or said aluminum anti-oxidation layer before arranging said isolative layer and said copper foil.

3. The method according to claim 1, further comprising the step of:
   if said I/O pad is made of aluminum or said I/O pad has an anti-oxidation layer made of aluminum, forming a zinc layer on a top surface of said aluminum I/O pad or said aluminum anti-oxidation layer after said via is formed.

4. The method according to claim 1, further comprising the step of:
   if said I/O pad is made of copper and said I/O pad has an anti-oxidation layer, removing said anti-oxidation layer before arranging said isolative layer and said copper foil.

5. The method according to claim 1, further comprising the step of:
   if said I/O pad is made of copper and said I/O pad has an anti-oxidation layer, removing said anti-oxidation layer after said via is formed.

6. The method according to claim 1, wherein said isolative layer is in one of a temporarily cured state and a liquid state; said copper foil is coated with said isolative layer first; said copper foil and said isolative layer are together stacked on said active side; said isolative layer is permanently solidified; and said via is then formed by removing a part of said isolative layer and said copper foil above said I/O pad.

7. The method according to claim 1, wherein said isolative layer is in one of a temporarily cured state and a liquid state; said isolative layer is stacked on said active side first; said copper foil is then stacked on a top surface of said isolative layer; said isolative layer is then permanently solidified; and said via is then formed by removing a part of said isolative layer and said copper foil above said I/O pad.

8. The method according to claim 1, wherein said isolative layer is in a liquid state and is applied to said active side first; said isolative layer is solidified into a temporarily cured state; said via is formed by removing part of said isolative layer above said I/O pad; said copper foiled is then stacked on a top surface of said isolative layer; said isolative layer is solidified permanently; and a part of said copper foil above said via is removed.

9. The method according to claim 1, further comprising the step of:
   thinning down said copper foil, if a fine-pitched metallic bump is required.

10. The method according to claim 1, wherein said thin metallic layer is made of one of copper and nickel.

11. The method according to claim 1, further comprising the step of:
forming an additional metal layer on an external surface of said thin metallic layer before forming said first plating resist.

12. The method according to claim 1, wherein said metallic material is one of gold, copper, tin, nickel, solder, and a combination thereof.

13. The method according to claim 1, further comprising the steps of:
removing said first plating resist and part of said copper foil beneath said first plating resist; and
forming a coating layer for anti-oxidation at least on a top surface of said metallic material.

14. The method according to claim 1, further comprising the steps of:
forming a coating layer for anti-oxidation on a top surface of said metallic material; and
removing said first plating resist and part of said copper foil beneath said first plating resist.

15. The method according to claim 1, wherein said first opening further exposes one of a rerouted location and an intermediate location of said metallic bump and a routing trace connecting said rerouted location or intermediate location to said via; and the plating of said metallic material forms said routing trace.

16. The method according to claim 15, further comprising the step of:
forming a blind hole in said isolative layer at said rerouted location before forming said thin metallic layer;
wherein said thin metallic layer further covers said blind hole.

17. The method according to claim 15, further comprising the steps of:
forming a blind hole in said isolative layer at said rerouted location before forming said thin metallic layer; and
filling said blind hole with a conductive paste before forming said first plating resist.

18. The method according to claim 15, further comprising the steps of:
forming a second plating resist on a top surface of said first plating resist and said routing trace, said second plating resist having a second opening exposing said rerouted location;
plating a second metallic material in said second opening until an appropriate thickness is achieved; and
forming said metallic bump by removing said first and second plating resists, and part of said copper foil beneath said first plating resist.

19. The method according to claim 18, wherein said second metallic material is one of gold, copper, tin, nickel, solder, and a combination thereof.

20. The method according to claim 18, further comprising the step of:
applying a solder mask to cover said routing trace and said via after removing said first and second plating resists and said copper foil.

21. The method according to claim 1, wherein said first opening further exposes a rerouted location of said metallic bump, a routing trace connecting said rerouted location and said via, at least a plating bar connecting a plating electrode of said semiconductor device to a plating net comprising said via, said routing trace, and said rerouted metallic bump; and the plating of said metallic material forms said routing trace and said plating bar.

22. The method according to claim 21, further comprising the steps of:
removing said first plating resists, and part of said copper foil beneath said first plating resist;
applying a solder mask to expose said rerouted location, a part of said plating bar, and said plating electrode;
forming a second plating resist on said solder mask, said second plating resist having a second opening exposing said rerouted location and said plating electrode;
forming said metallic bump by plating a second metallic material in said second opening until an appropriate thickness is achieved; and
removing said second plating resist and said plating bar.

23. The method according to claim 22, wherein said second metallic material is one of gold, copper, tin, nickel, solder, and a combination thereof.

24. The method according to claim 15, further comprising the steps of:
removing said first plating resists, and part of said copper foil beneath said first plating resist;
arranging a second isolative layer and a second copper foil in this order on said active side of said semiconductor device, said second isolative layer and said second copper foil having a second via at said intermediate location;
forming a second thin metallic layer at least in said second via;
forming a second plating resist on a top surface of said second copper foil, said second plating resist having a second opening exposing said second via coated with said second thin metallic layer, said rerouted location of said metallic bump, and a second routing trace connecting said rerouted location to said second via;
forming said second routing trace by plating a second metallic material in said second opening until an appropriate thickness is achieved;
forming a third plating resist on a top surface of said second plating resist and said second routing trace, said third plating resist having a third opening exposing said rerouted location;
plating a third metallic material in said third opening until an appropriate thickness is achieved; and
forming said metallic bump by removing said second and third plating resists, and part of said second copper foil under said second plating resist.

25. The method according to claim 24, further comprising the step of:
forming a blind hole in said second isolative layer and said second copper foil at said rerouted location before forming said second thin metallic layer;
wherein said second thin metallic layer further covers said blind hole.

26. The method according to claim 24, further comprising the steps of:
forming a blind hole in said second isolative layer and said second copper foil at said rerouted location before forming said second thin metallic layer; and
filling said blind hole with a conductive paste before forming said second plating resist.

27. The method according to claim 24, wherein said second and third metallic materials are one of gold, copper, tin, nickel, solder, and a combination thereof.

28. The method according to claim 1, wherein said semiconductor device is one of a semiconductor wafer and a part of a semiconductor wafer after separation.

* * * * *